(12) United States Patent
Burchard et al.

(10) Patent No.: US 8,916,944 B2
(45) Date of Patent: Dec. 23, 2014

(54) STRESS-SENSITIVE MICRO-ELECTROMECHANICAL DEVICE AND USE THEREOF

(75) Inventors: Bernd Burchard, Dortmund (DE); Michael Doelle, Milpitas, CA (US); Zhou Ningning, Milpitas, CA (US)

(73) Assignees: ELMOS Semiconductor AG, Dortmund (DE); Silicon Microstructures, Inc., Milpitas, CA (US)

( * ) Notice: Subject to any disclaimer, the term of this patent is extended or adjusted under 35 U.S.C. 154(b) by 0 days.

(21) Appl. No.: 13/583,392

(22) PCT Filed: Mar. 15, 2011

(86) PCT No.: PCT/EP2011/053840
§ 371 (c)(1),
(2), (4) Date: Jan. 18, 2013

(87) PCT Pub. No.: WO2011/117105
PCT Pub. Date: Sep. 29, 2011

(65) Prior Publication Data
US 2013/0193535 A1 Aug. 1, 2013

(30) Foreign Application Priority Data

Mar. 26, 2010 (EP) ..................................... 10157917

(51) Int. Cl.
*H01L 33/00* (2010.01)
*B81B 3/00* (2006.01)
(52) U.S. Cl.
CPC ....... *B81B 3/0072* (2013.01); *B81B 2201/0257* (2013.01); *B81B 2201/0264* (2013.01)
USPC ........................................................ 257/418
(58) Field of Classification Search
None
See application file for complete search history.

(56) References Cited

U.S. PATENT DOCUMENTS

| 6,426,013 B1 * | 7/2002 | Neukermans et al. .......... 216/24 |
| 2002/0044327 A1 | 4/2002 | Fujita et al. |

(Continued)

FOREIGN PATENT DOCUMENTS

| WO | 2006081888 A2 | 8/2006 |
| WO | 2009087055 A1 | 7/2009 |

OTHER PUBLICATIONS

International Search Report dated Sep. 12, 2011 for corresponding PCT Application No. PCT/US2011/053840, (3 pgs.).

(Continued)

*Primary Examiner* — Whitney T Moore
*Assistant Examiner* — Joseph Galvin, III
(74) *Attorney, Agent, or Firm* — Shumaker & Sieffert, P.A.

(57) ABSTRACT

The micro-electromechanical device has a substrate. Integrated into the substrate is a micromechanical component that has a bending element which can be bent reversibly and which has a first end connected to the substrate and extends from the first end over a free space. The bending element has at least one web having two side edges, the course of which is defined by depressions introduced into the bending element and adjacent to the side edges. In order to form a homogenization region located within the web, in which mechanical stresses occurring during bending of the bending element are substantially equal, the mutual spacing of the side edges of the web decreases, as viewed from the first end of the bending element. The device further comprises at least one microelectronic component that is sensitive to mechanical stresses and embedded in the web in the homogenization region of the latter.

10 Claims, 8 Drawing Sheets

(56) References Cited

U.S. PATENT DOCUMENTS

Figure 1:
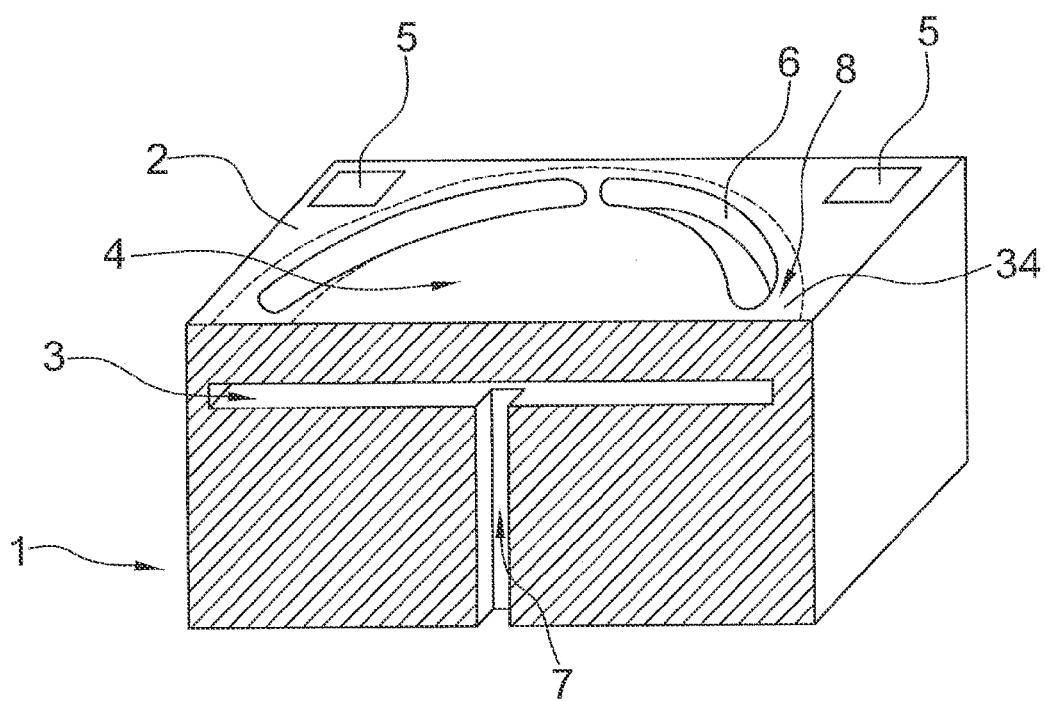

| | | | |
|---|---|---|---|
| 2004/0020292 A1 | 2/2004 | Deng | |
| 2005/0067621 A1* | 3/2005 | Goto et al. | 257/71 |
| 2005/0230708 A1* | 10/2005 | Reichenbach et al. | 257/200 |
| 2008/0216583 A1* | 9/2008 | Bargatin et al. | 73/777 |
| 2009/0134522 A1* | 5/2009 | Smith et al. | 257/769 |

OTHER PUBLICATIONS

Written Opinion dated Sep. 26, 2012 for corresponding PCT Application No. PCT/US2011/053840, (11 pgs.).

Dibi et al., "Combined effect of the membrane flatness defect and real dimensions gauges on the sensitivity of a silicon piezoresistive pressure sensor," Proceedings of IEEE Sensors 2002, Orlando, FL, Jun. 12-14, 2002 (4 pgs.).

* cited by examiner

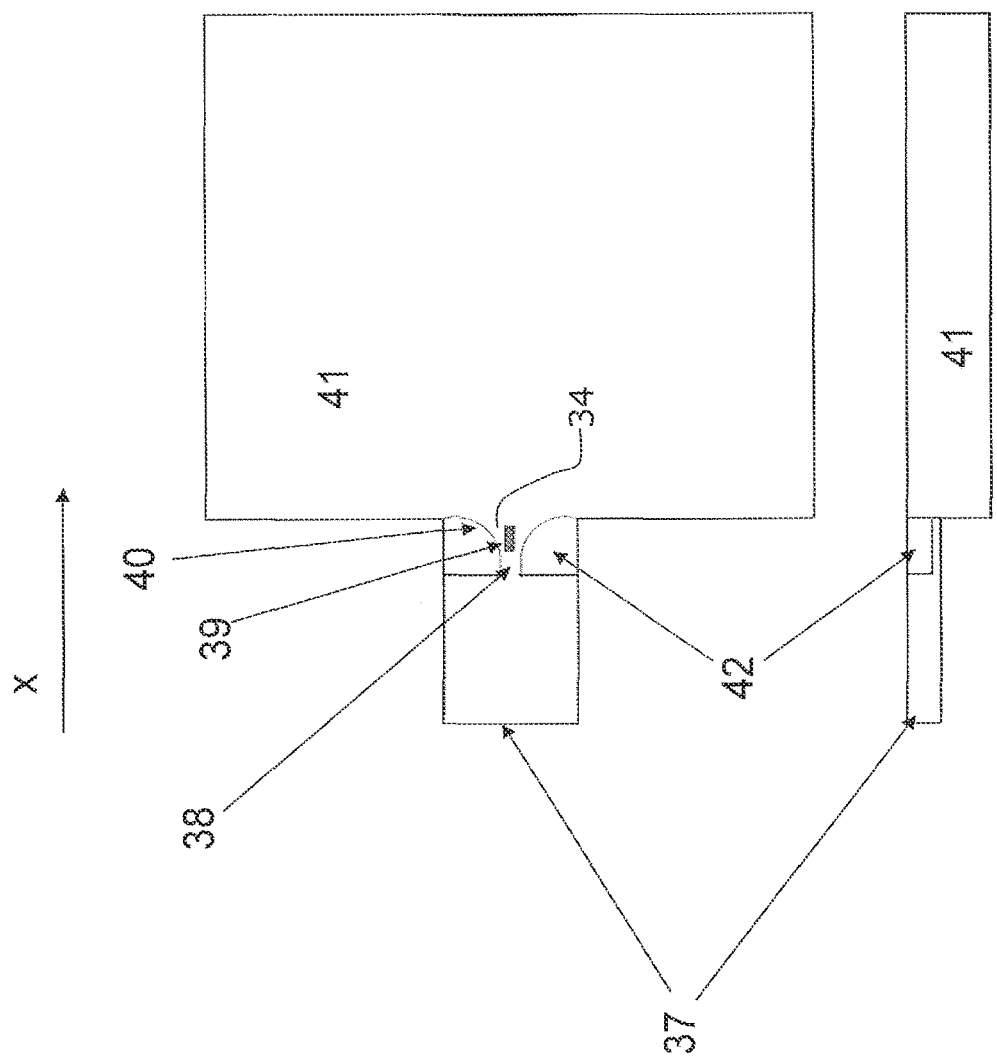

STRESS-SENSITIVE MICRO-ELECTROMECHANICAL DEVICE AND USE THEREOF

The invention generally relates to a micro-electromechanical device which is compatible with conventional semiconductor manufacturing processes and has a low manufacturing dispersion. A special exemplary embodiment of the invention is a micromechanical CMOS pressure sensor with low manufacturing dispersion.

In micro-electromechanical devices, the exact relative positioning of electronic components integrated in a semiconductor substrate, particularly of piezoresistive resistors or transistors, relative to micromechanical structures also integrated in the semiconductor substrate, is of considerable importance for the correct functioning of the device. Such micro-electromechanical devices comprise micromechanical components whose function is influenced, on the one hand, intentionally e.g. due to mechanical material stresses, i.e. for constructional reasons, but, on the other hand, also by parasitic effects. Typically, in the field of micro-electromechanics, the electronic and micromechanical components are produced in a planar manner by photolithography. The micromechanical components can comprise e.g. plates, membranes and bars which are clamped on all sides or are not clamped on all sides, as well as more-complex forms. As examples of such micromechanical components, there can be mentioned unilaterally clamped bars (beams, cantilevers) for oscillating systems, pressure membranes for pressure sensors, or centrally supported circular disks for oscillators.

The micromechanical production of these micromechanical components and respectively structures, when seen in relation to the absolute dimensions of the micromechanical components which typically are in the μm or maximally in the mm range, has considerably higher relative production tolerances than is the case in conventional non-micromechanical devices. In this respect, when designing the production processes, special care has to be taken that the concept and the production methodology are selected to the effect that the resultant process construction will—with regard to the process result (i.e. the micro-electromechanical device)—react in a robust manner on said unavoidable parameter variations. In this context, the construction of the device which is to be produced goes hand in hand with the process construction; both are not entirely separable.

Particularly in the pressure sensors described herein by way of example, it has been customary practice in the past to select the design of a deformable bending element in such a manner that a local region of maximal material stresses is generated in which there will be placed the sensor element which is sensitive to mechanical stresses, for thus achieving a maximal measuring signal. The size of said region of maximal material stresses is only small, so that a misplacement of the sensor element as caused by manufacturing tolerances will cause massive nonlinearities and offset variations. This in turn will entail expenditure for calibration and testing which may account for about ¾ of the production costs of micromechanical pressure sensor systems in addition to the production costs for the sensor itself.

It is an object of the invention, in such micromechanical components wherein a material stress field is of importance under the functional or parasitic aspect, to keep this material stress field under control in such a manner that the effects of said manufacturing dispersions on the measurement-based determination of the material tensions will be minimized.

To achieve the above object, there is proposed, according to the invention, a micro-electromechanical device comprising
  a substrate suitable for the production of microelectronic components, in particular a semiconductor substrate,
  a micromechanical component integrated into the substrate, said micromechanical component comprising a bending element which can be bent reversibly and which has a first end connected to the substrate and extends from said first end over a free space to a second end,
  said bending element comprising at least one web having two side edges, the course of said side edges being defined by depressions introduced into the bending element and adjacent to said side edges, and
  wherein, to form a homogenization region located within the web, in which mechanical stresses occurring during bending of the bending element are substantially equal, the mutual spacing of the side edges of the web decreases, as viewed from the first end of the bending element in the direction of the second end of the web, and
  at least one microelectronic component sensitive to mechanical stresses, said microelectronic component being integrated in the web within the homogenization region of the web.

The essential feature of the micro-electromechanical device of the invention is the modeling of the material stress field within a reversibly bendable bending element to the effect that, within this material stress field, the occurring material stresses are substantially equal. According to the invention, this is achieved by reducing the width of the web in a portion of its longitudinal extension from the clamped first end to the freely movable second end. The web is a part of the bending element and is defined by lateral edges which themselves are defined by depressions formed in the bending element on both sides of the web. Thus, on its first end connected to the substrate, the bending element has, on both sides of the web, a smaller thickness than in the region of the web. The web itself has a decreasing width when viewed from the first end of the bending element, wherein this decrease can be continuous, quasi-continuous, or continuous in a stepwise or portion-wise manner, or quasi-continuous in a portion-wise manner. The function describing the development of a lateral edge of the web can be linear, quadratic, exponential, steady, steadily monotonic, differentiable, steady in a portion-wise manner, steadily monotonic in a portion-wise manner or differentiable in a portion-wise manner. Also other developments of the function are possible. What is decisive is that the width of the web within that region in which the homogenization region is to be generated, decreases all the more the larger the distance from the clamped first end of the bending element and respectively of the web becomes. The development along both lateral edges of the web relative to a central line of the web is preferably symmetric.

The bending element can be e.g. a cantilevered beam clamped on one side, a beam clamped on both sides, a beam clamped on multiple sides, and respectively a membrane, plate or the like. A common feature of all bending elements resides in that they undergo a reversible bending when subjected to forces or pressures.

By the solution according to the invention, i.e. in that the sensor element which is sensitive to material tension is not necessarily arranged in the extremely limited region of maximal material tensions but that, instead, the bending element is geometrically designed in such that, within the web, a relatively large-surfaced region is generated in which the material stress gradient is substantially zero, a precise placement of the sensor element is not of essence anymore because this sensor element is merely required to be situated at least partly, but preferably fully within the homogeneity region. Thus, misplacements of the sensor element caused by manufacturing tolerances now will not have disadvantageous effect on manufacturing dispersions and the like anymore. Further, complex calibration and testing processes subsequent to the production of the micro-electromechanical device can be omitted or reduced with cost-saving effect.

In a special embodiment of the micro-electromechanical device of the invention, the homogenization region is enlarged in the width or length extension of the web. Further, it can be provided that the homogenization region in the width and/or length extension of the web is by a presettable minimum factor larger than the extension of the microelectronic component in the respective width and/or length extension of the web. For instance, said factor can be at least six sigma, wherein sigma is the positioning accuracy—defined by the process for production of microelectronic components—of the microelectronic component arranged in the homogenization region relative to the position of this homogenization region.

The bending element of the microelectromechanical device of the invention can be formed by etching the substrate, preferably by DRIE- or plasma etching. Examples of possible applications of the device of the invention are a pressure sensor, an acceleration sensor or a resonator.

Figure 2:
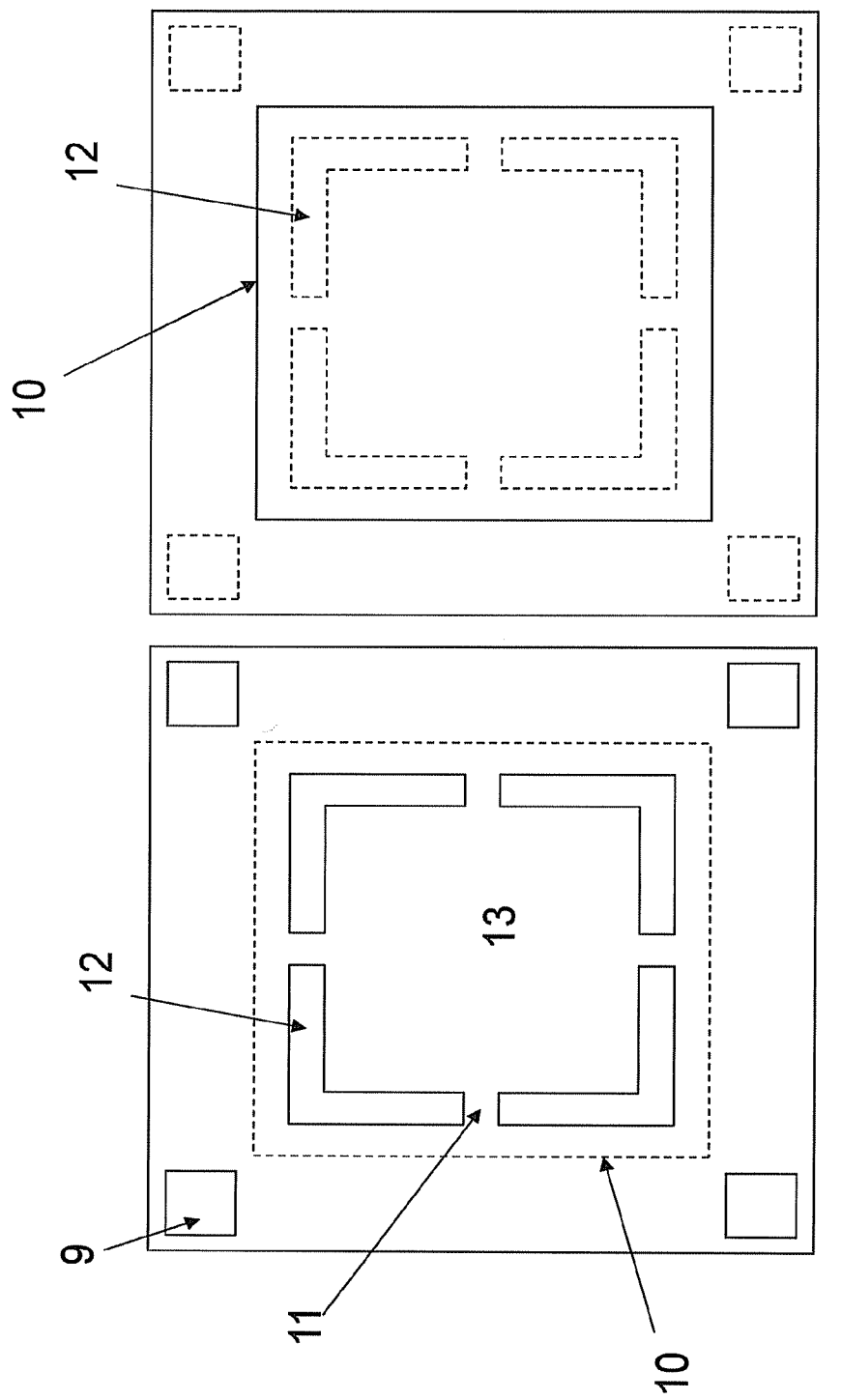
Figure 3:
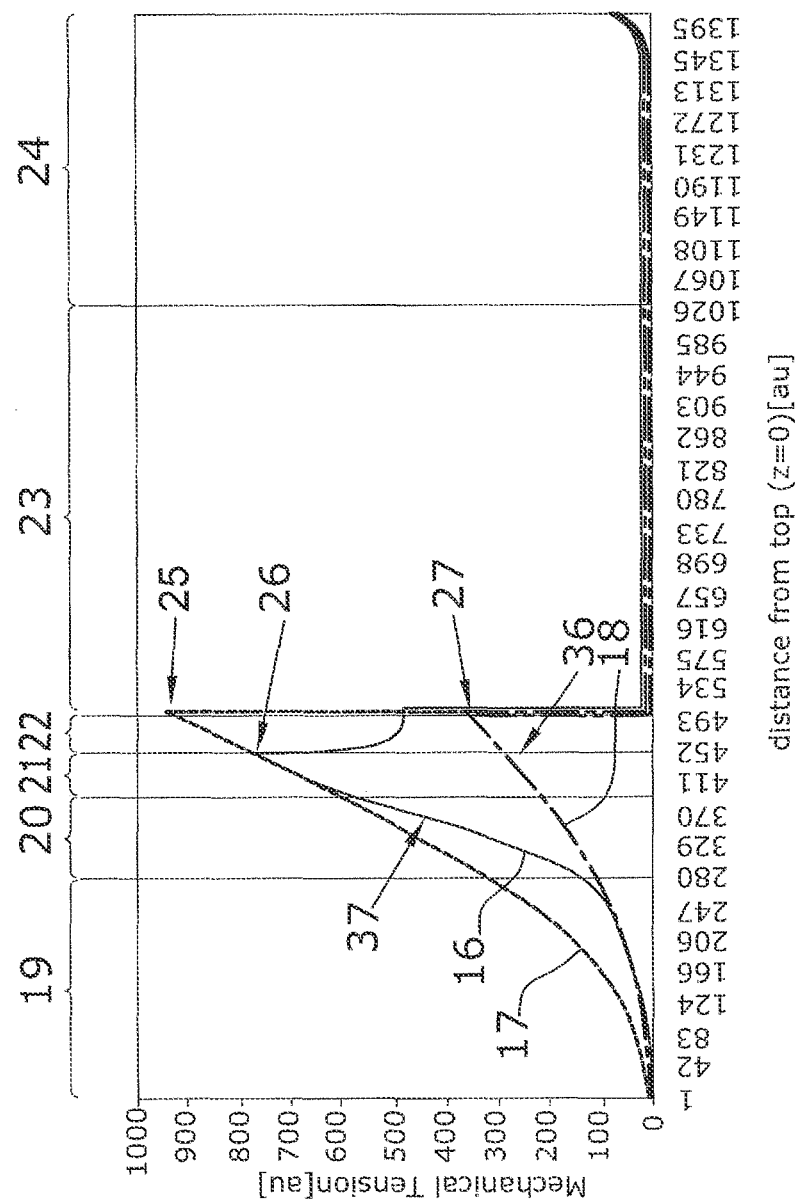
Figure 4:
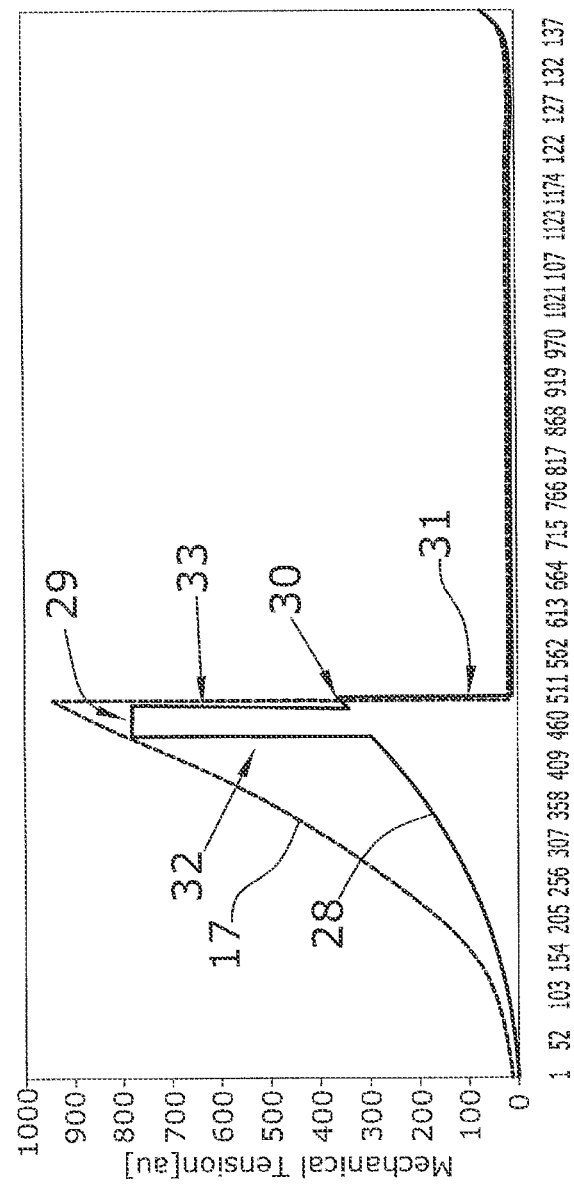
Figure 5:
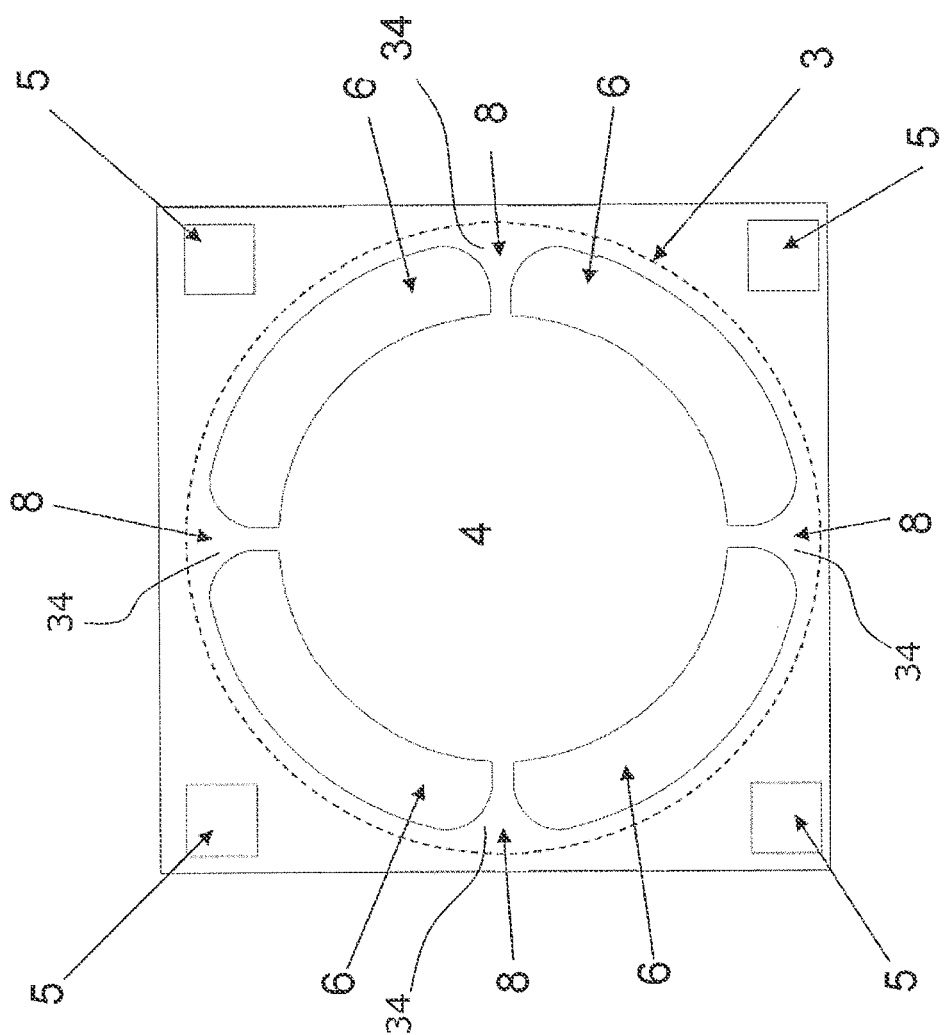
Figure 6:
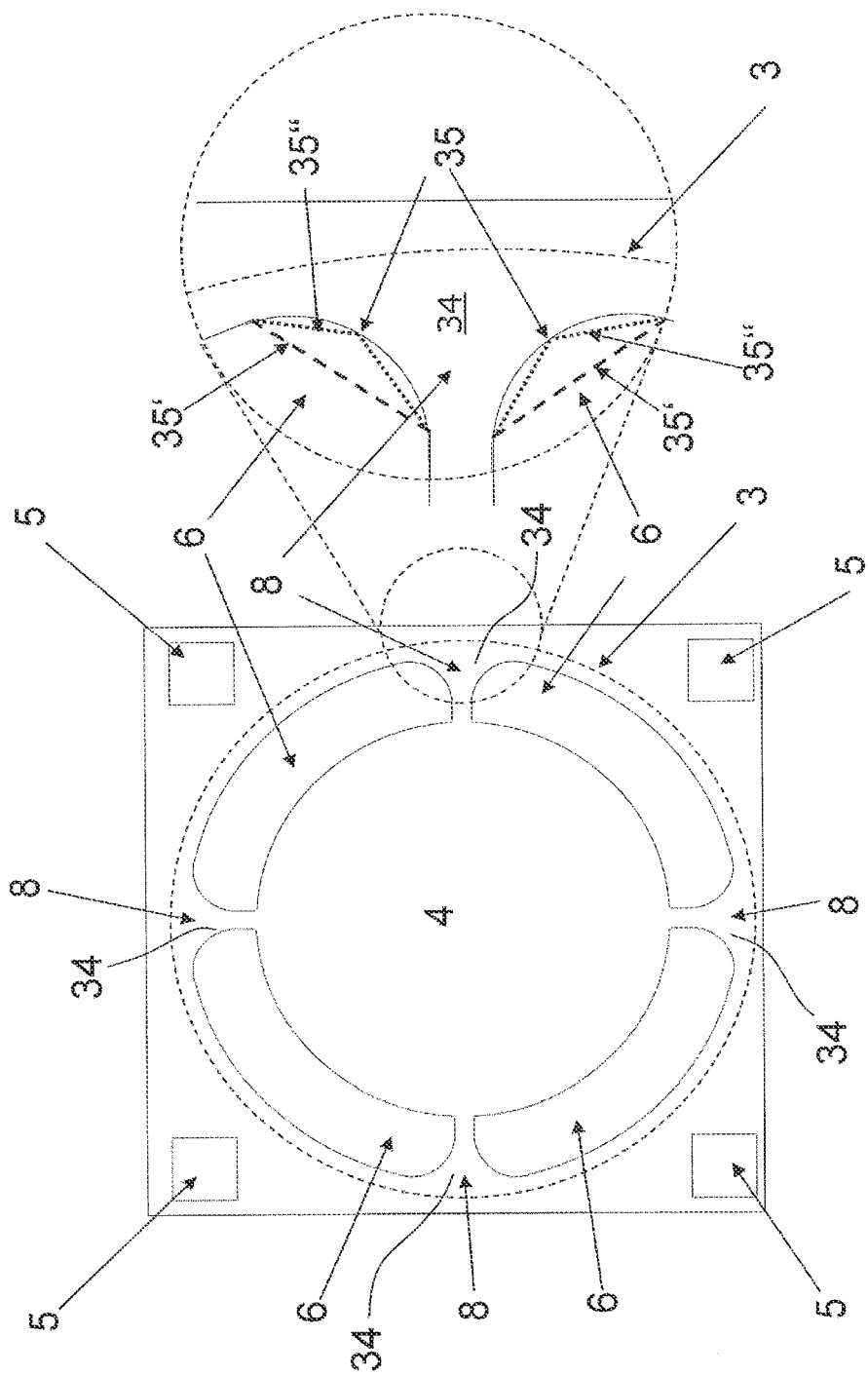
Figure 7:
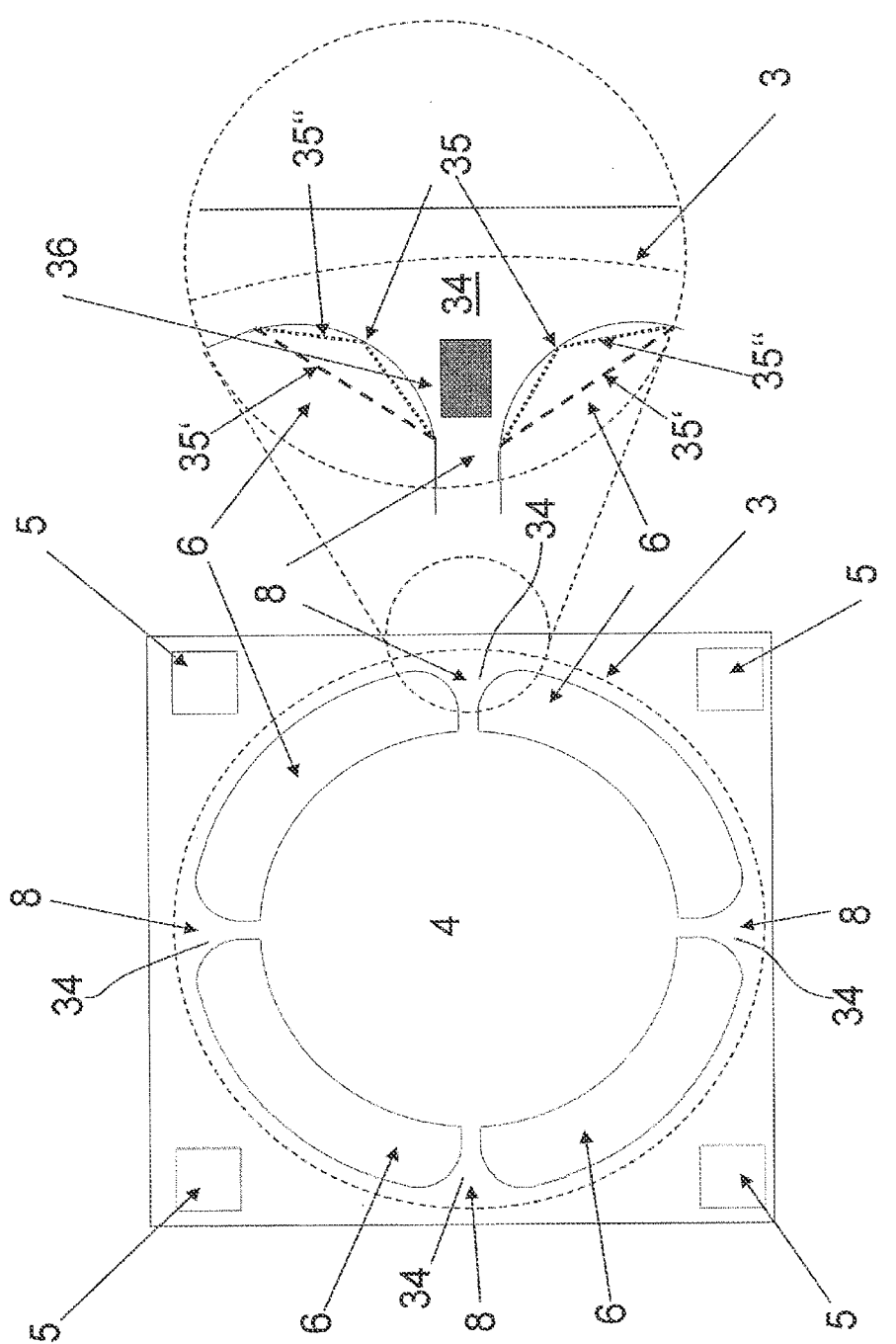

The invention will be explained hereunder by way of a pressure sensor in accordance with the invention while making reference to the drawing. The individual Figures show the following:

FIG. 1 a schematic cross-sectional view of an exemplary micromechanical pressure sensor according to the invention, FIG. 2 a plan view of pressure sensor according to the state of the art, FIG. 3 the mechanical tension conditions in dependence on the radius in an exemplary pressure sensor according to the state of the art, FIG. 4 an idealized development of the tension in an optimized pressure sensor according to the invention with plateau or constant region, which allows for a production-stable placement of stress-sensitive electronic components, e.g. piezoresistive resistors or MOS transistors, FIG. 5 a plan view of an exemplary pressure sensor with optimized webs (bending bars and respectively bending elements), FIG. 6 a plan view of an exemplary pressure sensor with optimized webs, wherein the detailed part of the Figure schematically shows the optimized curve of the web edge which leads to a constant mechanical stress and thus to the desired stress plateau similar to that according to the curve in FIG. 4, FIG. 7 in addition to FIG. 6, a schematic illustration of the rough position of a stress-sensitive electronic component in the region of substantially constant material tension on the web, and FIG. 8 by way of example of a cantilever, the transfer of the invention to other microstructures, wherein, for better understanding, the cantilever is shown in lateral view and in plan view.

FIG. 1 schematically shows a differential pressure sensor on silicon basis (Si substrate) as an exemplary embodiment of the invention.

In the pressure sensor body made of a (semiconductor) substrate 1, a cavity 3 is formed, with a membrane 4 extending over the latter on the top side 2 of substrate 1. In said membrane 4, trenches 6 are etched from above into the top side 2 of substrate 1 while, however, not passing all the way through the membrane 4. Said trenches are interrupted by webs and respectively beams 8. The membrane 4, the trenches 6 and the webs and respectively beams 8 constitute a reversibly deformable bending element; the measurement-based determination of the bending and thus of the force and respectively pressure influence on the bending element is performed by measuring the mechanical tensions to which e.g. one of the webs is exposed.

To make it possible to measure a differential pressure with the aid of the pressure sensor, said cavity 3 is connected to the ambience via a channel 7. For measurements of the absolute pressure, the cavity 3 would have to be entirely closed toward the ambience.

FIG. 2 is a plan view of a pressure sensor corresponding to the state of the art. As in the above described pressure sensor of the invention, the known pressure sensor comprises a cavity situated under the top side of the sensor. Similar to the sensor according to the embodiment of the invention, trenches 12 are formed in the top side. The known sensor, as, by the way, also the sensor according to the embodiment, is electrically connected via pads 9. Further details, such as e.g. the actual sensor elements, are not depicted in FIG. 2. According to the state of the art, the webs 11 are designed as beams having a constant width, or as beams with a constant angle relative to the center of the sensor.

Different from the known sensor of the state of the art according to FIG. 2, the width of the beams and respectively webs 8 of the sensor of the invention is modulated to the effect that the mechanical stress occurring when a beam is being bent will—at least in a partial region—be constant in case of an ideal embodiment and nearly constant in case of a real embodiment.

This means that the stress field in the beam is modulated and controlled by the cross section of the beam. If, now, a sensor is to be placed on the beam, it is—for production-related reasons—in fact not useful to maximize the stress as is common practice today; instead, the occurring mechanical stress within a region of the beam should be stabilized in the sense of homogenization in such a manner that, even in view of the unavoidable placement errors of the stress-sensitive element, the mechanical stress to which said stress-sensitive element is exposed will—irrespective of the attained placement—as far as possible not be different.

FIG. 3 shows the stress development, averaged by simplified analytic computation, in the membrane of a pressure sensor of the state of the art. If the whole membrane surface is etched by the trench depth, the stress in the thus obtained membrane will be especially high and will follow the upper curve 17,37. If no trench is etched, the average mechanical stress will approximately follow the lower curve 18,36. The curve of a sensor designed similar to the plan view shown in FIG. 2 will approximately follow the curve 18 and will move between the two extremes. In the region 19, which is the region of the center of the pressure sensor membrane 13, the tension will follow the lower curve 36. If the radius of the observed sectional circle becomes so large that the sectional circle does not lie completely in the pressure sensor membrane 13 anymore but intersects the region of the trench 12, the average mechanical stress begins to increase in the distance range 20 from the center until the sectional circle will have been fully situated in the trench 12 and the curve in the region 21 will then follow the curve 37. This will continue until said radius will have become so large that the sectional circle is larger than the trench 12. Then, the mechanical stress will drop again in the distance range 22 from the center until reaching again the curve 36 or, as here, until the sectional circle also leaves the cavity 10. In this case, there will occur a massive decrease of the mechanical stress because, then, the entire body of the sensor can take up the residual stress (see the distance ranges 23 and 24 from the center).

What is of disadvantage is that the mechanical stress in the distance ranges 19 to 22 from the center is never constant. As a consequence, placement inaccuracies of stress-sensitive components, e.g. of piezoresistive resistors, will have a massive influence on the system performance and the resulting manufacturing differences.

Particularly a positioning on the maxima 25,26,27 of the stress curves is extremely unfavorable under the aspect of production technology because, according to the radius, the dissipation of the mechanical stress is maximal and, for this reason, it is there where the sensitivity to manufacturing variations is highest.

FIG. 4 shows an exemplary desirable stress development 28, while also the course of the curve 17 of FIG. 3 is plotted once more in FIG. 4. The stress development 28 is characterized by a steep rise 32 and a steep decline 33 as well as—and this is the essential point—by an inventive plateau 29 of consistent stress arranged between said rise and said decline, wherein the position of said plateau is selected in such a manner that, in case of the typical known placement inaccuracies, the size of the component is on both sides by three sigma smaller than the plateau 29. Thereby, it is safeguarded that the component with regard to this context can be manufactured to have a Cpk value of 2. Since said cavity 3 normally cannot be produced with a particularly good placement accuracy relative to structures on the front side, it is reasonable to cause the first stress decline 33 to occur at a certain distance of three sigma of this placement accuracy before the boundary of the cavity (see at 30 in FIG. 4) where the further stress decline 31 will occur.

In FIG. 5, the exemplary pressure sensor of the invention shown in plan view. The membrane 4 herein is circular, and the trenches 6 extend in a curved manner and along the periphery of membrane 4. However, the invention is also applicable in a rectangular membrane with angular course of the trenches, as shown in FIG. 2.

On the right-hand side of FIG. 6, the essential aspect of the invention on the basis of FIG. 5 is shown once more at an enlarged scale: By a suitable shape 35 of the lateral edges of the webs 8 which interrupt the trenches 6, the cross section of each web 8 is changed in such a manner in dependence on the radius (distance from the center of the pressure sensor membrane) that, in case of a deflection of the membrane, a constant stress profile (see plateau 29 in FIG. 4) will be generated in the region of the (curve) shape 35. The "attachment" of the webs 8 to the bulk silicon (see, in FIG. 1, the regions radially outside of the cavity 3), i.e. the configuration of each web 8 at its first end 34, is selected such that the width of web 8 increases toward the first end 34, i.e. decreases toward the center of membrane 4. In this embodiment, this is realized by curved edge portions (see the development at 35) of the trenches 6, said curved edge portions extending laterally outward relative to web 8. Alternatively, said edge portions could also extend outward in a linear oblique manner, a stepped manner or in a polygonal manner. In other words, the (curve) shape 35 can also be approximated by linear portions or steps (see the various developments 35',35" indicated by interrupted lines in FIG. 6).

FIG. 7 shows an exemplary schematic placement of a stress-sensitive electronic component in relation to the web and the modeling curve shape 35 of the latter.

The principle of a profile modulated in this manner can of course also be applied in other sensors. The, for instance, it can be envisioned to use this principle also in cantilevers and resonators. FIG. 8 schematically shows an exemplary embodiment of the invention in connection with a cantilever 37. In the region of the stress-sensitive electronic component 39, said cantilever is modulated in its thickness. In this region, the cantilever comprises thinner portions 42 and unchanged portions 38. In this arrangement, the boundary curve 40 between said thinner portions 42 and non-thinned portion 38 is selected again such that the influence of a predetermined force on the cantilever 37 will lead to a likewise predetermined deviation of the cantilever 37 relative to the sensor bulk 41 and that this deflection in turn will lead to a mechanical stress in the region of the stress-sensitive electronic component 39 that is nearly constant in the x-direction (see marking in FIG. 8).

Now, should there occur manufacturing errors which lead to a displacement of the electronic component relative to the micromechanical structures, such displacement will have no effect if the stress field is constant and the region of constancy is not left. If the stress field is just nearly constant, the displacement will merely cause a very slight effect as compared to a solution according to the state of the art. Thus, by way of such a stress field modulation, the objective of an improved manufacturability is accomplished.

It is advisable to produce the corresponding structures by DRIE or plasma etching since this will allow for a free selection of the shapes.

The invention claimed is:

1. A micro-electromechanical device comprising:
   a substrate suitable for the production of microelectronic components, in particular a semiconductor substrate; and
   a micromechanical component integrated into the substrate, the micromechanical component comprising a bending element which can be bent reversibly and which has a first end connected to the substrate and extends from the first end over a free space;
   the bending element comprising at least one web having two side edges, the course of the side edges being defined by depressions introduced into the bending element and adjacent to the side edges, the depressions comprising trenches including side walls and a bottom wall,
   wherein, to form a homogenization region located within the web, in which mechanical stresses occurring during bending of the bending element are substantially equal, the mutual spacing of the side edges of the web decreases, as viewed from the first end of the bending element, and
   at least one microelectronic component sensitive to mechanical stresses, the microelectronic component being integrated in the web within the homogenization region of the web.

2. The micro-electromechanical device according to claim 1, wherein the homogenization region is enlarged in the width and length extension of the web.

3. The micro-electromechanical device according to claim 1, wherein the microelectronic component is arranged completely within the homogenization region of the web.

4. The micro-electromechanical device according to claim 1 wherein the homogenization region in the width and/or length extension of the web is by a presettable minimum factor larger than the extension of the microelectronic component in at least one of the respective width or length direction of the web.

5. The micro-electromechanical device according to claim 4, wherein the factor is at least six sigma, wherein sigma is the positioning accuracy, defined by the process for production of microelectronic components, of the microelectronic component arranged in the homogenization region relative to the position of this homogenization region.

6. The micro-electromechanical device according to claim 1, wherein the bending element is a membrane, a plate, a beam or a disk.

7. The micro-electromechanical device according to claim 1, wherein the bending element is formed by etching the substrate.

8. The micro-electromechanical device according to claim 1 wherein the decrease of the width of the web is continuous, quasi-continuous, or continuous in a portion-wise manner or is stepped, and wherein a function describing the development of a lateral edge of the web is linear, quadratic, exponential, steady, monotonic, differentiable, steady in a portion-wise manner, monotonic in a portion-wise manner, or differentiable in a portion-wise manner.

9. The micro-electromechanical device according to claim 1, wherein the development of both lateral edges of the web relative to a central line extending in the longitudinal direction of the web is symmetric.

10. The micro-electromechanical device according to claim 1, wherein each microelectronic component is integrated in the web within the homogenization region of the web.

* * * * *